(12) United States Patent
Ono et al.

(10) Patent No.: US 11,335,839 B2
(45) Date of Patent: May 17, 2022

(54) GROUP III NITRIDE SEMICONDUCTOR LIGHT EMITTING DIODE, AND METHOD FOR PRODUCING SAME

(71) Applicant: Panasonic Corporation, Osaka (JP)

(72) Inventors: Hiroshi Ono, Osaka (JP); Kenya Yamashita, Hyogo (JP); Akihiko Ishibashi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 136 days.

(21) Appl. No.: 16/506,167

(22) Filed: Jul. 9, 2019

(65) Prior Publication Data

US 2020/0014431 A1   Jan. 9, 2020

(30) Foreign Application Priority Data

Jul. 9, 2018  (JP) .............................. JP2018-129975

(51) Int. Cl.
  *H01L 33/60* (2010.01)
  *H01L 33/00* (2010.01)
  *H01L 21/02* (2006.01)

(52) U.S. Cl.
  CPC .......... *H01L 33/60* (2013.01); *H01L 21/0254* (2013.01); *H01L 33/007* (2013.01); *H01L 33/0093* (2020.05)

(58) Field of Classification Search
  CPC . H01L 33/54; H01L 33/0075; H01L 33/0025; H01L 33/32–325; H01L 33/58; H01L 2933/0091
  See application file for complete search history.

(56) References Cited

U.S. PATENT DOCUMENTS

2005/0067623 A1* 3/2005 Ha ..................... H01L 33/387
                                                        257/79
2007/0072324 A1   3/2007 Krames et al.
(Continued)

FOREIGN PATENT DOCUMENTS

JP   4118370        7/2008
JP   2017-178766   10/2017

OTHER PUBLICATIONS

Extended European Search Report dated Nov. 8, 2019 in corresponding European Patent Application No. 19185012.2.

*Primary Examiner* — Amar Movva
(74) *Attorney, Agent, or Firm* — Wenderoth, Lind & Ponack, L.L.P.

(57) ABSTRACT

The object of the present invention is to provide a Group III nitride semiconductor light emitting diode having improved light extraction efficiency. A Group III nitride semiconductor light emitting diode according to the present disclosure includes an $RAMO_4$ layer including a single crystal represented by the general formula $RAMO_4$ (wherein R represents one or more trivalent elements selected from the group consisting of Sc, In, Y and lanthanoid elements, A represents one or more trivalent elements selected from the group consisting of Fe (III), Ga and Al, and M represents one or more divalent elements selected from the group consisting of Mg, Mn, Fe (II), Co, Cu, Zn and Cd); and a layered product stacked on the $RAMO_4$ layer. The layered product includes at least a light emitting layer including a Group III nitride semiconductor. A degree of flatness of a surface, of the $RAMO_4$ layer, opposite to the layered product is lower than a degree of flatness of a surface, of the $RAMO_4$ layer, adjacent to the layered product.

2 Claims, 9 Drawing Sheets

(56) References Cited

U.S. PATENT DOCUMENTS

| | | |
|---|---|---|
| 2007/0126017 A1 | 6/2007 | Krames et al. |
| 2014/0048817 A1* | 2/2014 | Gardner .................. H01L 33/02 257/76 |
| 2015/0115299 A1 | 4/2015 | Grundmann et al. |
| 2017/0278754 A1 | 9/2017 | Tashiro et al. |

* cited by examiner

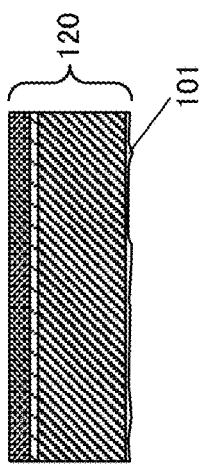
FIG. 2A
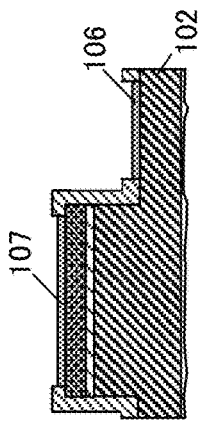
FIG. 2B
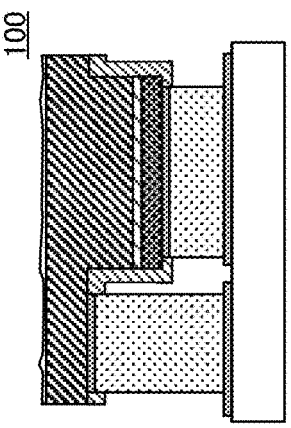
FIG. 2C
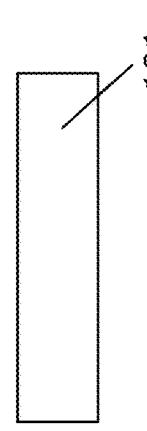
FIG. 2D
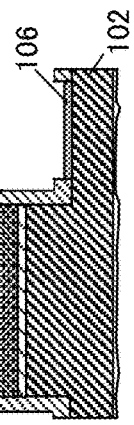
FIG. 2E
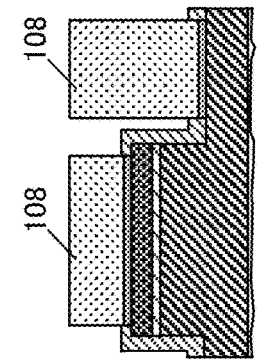
FIG. 2F
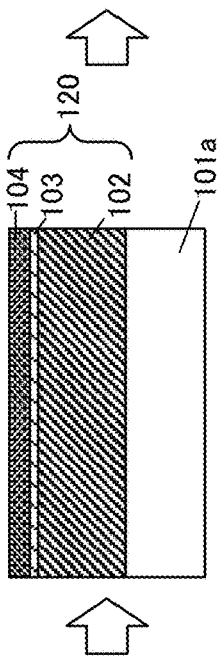
FIG. 2G
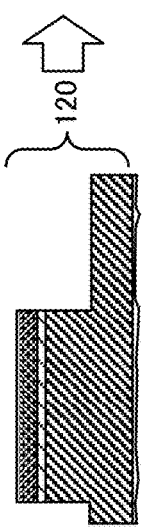
FIG. 2H
FIG. 2I

GROUP III NITRIDE SEMICONDUCTOR LIGHT EMITTING DIODE, AND METHOD FOR PRODUCING SAME

CROSS REFERENCE TO RELATED APPLICATIONS

This application is entitled to and claims the benefit of Japanese Patent Application No. 2018-129975, filed on Jul. 9, 2018, the disclosure of which including the specification, drawings and abstract is incorporated herein by reference in its entirety.

TECHNICAL FIELD

The present disclosure relates to a Group III nitride semiconductor light emitting diode, and a method for producing the Group III nitride semiconductor light emitting diode.

BACKGROUND ART

Group III nitride-based compound semiconductors (herein, also referred to as "Group III nitride semiconductors") such as gallium nitride (GaN) attract attention as materials for recent devices such as light emitting diodes (LEDs), laser diodes (LDs) and power devices. The Group III nitride semiconductor is a compound semiconductor represented by the general formula $In_xGa_yAl_{1-x-y}N$ ($0 \leq x \leq 1$, $0 \leq y \leq 1$, $x+y \leq 1$), and including indium (In), gallium (Ga) and aluminum (Al) as Group III elements, and nitrogen (N) as a Group V element.

As substrates for devices including a Group III nitride semiconductor, heterogeneous substrates such as sapphire and Si have been conventionally used. However, thin films of Group III nitride semiconductor formed on the heterogeneous substrates have a high dislocation density, which makes it difficult for Group III nitride semiconductors to exhibit their physical potentials. Thus, GaN substrates which enable Group III nitride semiconductors to have a lower dislocation density have been commercialized, but there are problems that the dislocation density of the resulting Group III nitride semiconductor and the crystal orientation of the substrate still widely vary, and that the GaN substrates are expensive.

Currently, nitride-based LEDs mainly include those obtained using a sapphire substrate as a base substrate and those obtained using a GaN substrate as a base substrate. Si substrates are rarely used in LED applications because these substrates do not transmit light at an LED emission wavelength. Sapphire substrates which are the most commonly used are insulating substrates, and do not have a high thermal conductivity. Thus, as shown in FIG. 8, a flip-chip configuration is generally employed in which Group III nitride semiconductor layered product 820 including a light emitting layer is disposed on sapphire substrate 801, and p-side electrode 807 and n-side electrode 806 are disposed on one surface of layered product 820 (for example, Japanese Patent No. 4118370).

SUMMARY OF INVENTION

Technical Problem

However, there exists problems in flip-chip LEDs obtained by using a conventional sapphire substrate. In LED 800 shown in FIG. 8, light emitted from a light emitting layer through sapphire substrate 801 is extracted outside. However, due to a difference in refractive index of layered product 820 formed of a Group III nitride semiconductor and a refractive index of sapphire substrate 801, reflection occurs at an interface between layered product 820 and sapphire substrate 801. Further, reflection also occurs at an interface between sapphire substrate 801 and air or a fluorescent material layer (not shown) disposed adjacent to sapphire substrate 801, leading to lowering of light extraction efficiency.

The present disclosure solves the above-described problems, and the present disclosure aims to provide a Group III nitride semiconductor light emitting diode having a flip-chip structure and having high light extraction efficiency.

Solution to Problem

The present disclosure provides the following Group III nitride semiconductor light emitting diode: a flip-chip Group III nitride semiconductor light emitting diode, comprising: an $RAMO_4$ layer including a single crystal represented by the general formula $RAMO_4$ (wherein R represents one or more trivalent elements selected from the group consisting of Sc, In, Y and lanthanoid elements, A represents one or more trivalent elements selected from the group consisting of Fe (III), Ga and Al, and M represents one or more divalent elements selected from the group consisting of Mg, Mn, Fe (II), Co, Cu, Zn and Cd); and a layered product stacked on the $RAMO_4$ layer, in which the layered product includes at least a light emitting layer including a Group III nitride semiconductor, and a degree of flatness of a surface, of the $RAMO_4$ layer, opposite to the layered product is lower than a degree of flatness of a surface, of the $RAMO_4$ layer, adjacent to the layered product.

The present disclosure provides the following method for producing a Group III nitride semiconductor light emitting diode: a method for producing a Group III nitride semiconductor light emitting diode, the method comprising: forming a layered product on an $RAMO_4$ substrate including a single crystal represented by the general formula $RAMO_4$ (wherein R represents one or more trivalent elements selected from the group consisting of Sc, In, Y and lanthanoid elements, A represents one or more trivalent elements selected from the group consisting of Fe (III), Ga and Al, and M represents one or more divalent elements selected from the group consisting of Mg, Mn, Fe (II), Co, Cu, Zn and Cd), the layered product including at least a light emitting layer including a Group III nitride semiconductor; and peeling off a large part of the $RAMO_4$ substrate from the layered product while leaving a part of the $RAMO_4$ substrate remained after forming the layered product, in order to form an $RAMO_4$ layer having a surface with irregularities at on opposite side from the layered product.

Advantageous Effects of Invention

In a flip-chip Group III nitride semiconductor light emitting diode according to the present disclosure, light can be efficiently extracted from the light extraction surface, that is, from the $RAMO_4$ layer.

BRIEF DESCRIPTION OF DRAWINGS

FIGS. 2A to 2I are schematic diagrams illustrating a production flow of the Group III nitride semiconductor light emitting diode in Embodiment 1 of the present disclosure;

DESCRIPTION OF EMBODIMENTS

Hereinafter, embodiments of the present disclosure will be described with reference to the accompanying drawings.

Embodiment 1

Figure 1:
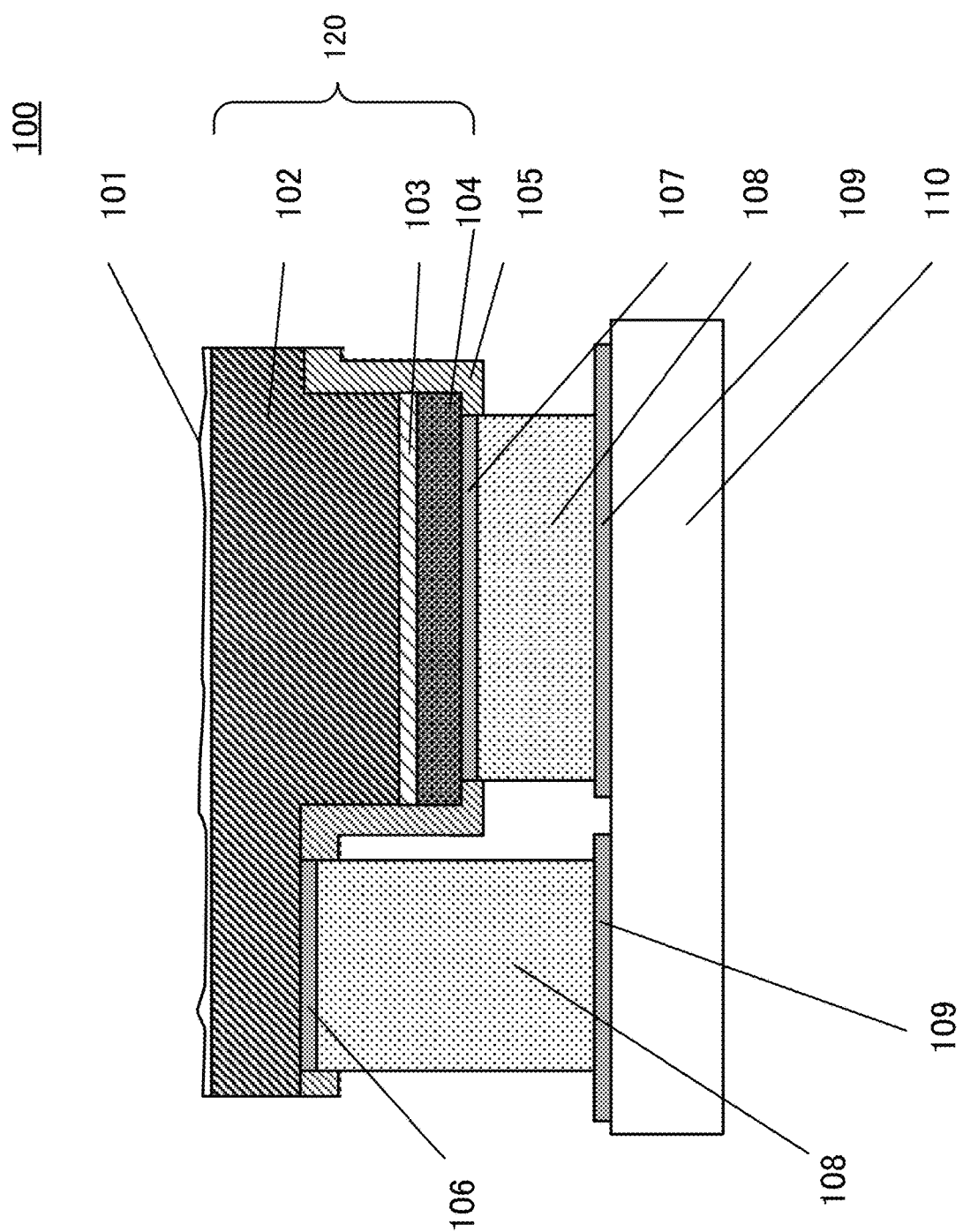
FIG. 1 is a schematic view of a Group III nitride semiconductor light emitting diode in Embodiment 1 of the present disclosure.

FIG. 1 is a schematic sectional view illustrating a flip-chip Group III nitride semiconductor light emitting diode (hereinafter, also referred to simply as "LED") 100 in Embodiment 1 of the present disclosure. As shown in FIG. 1, LED 100 in Embodiment 1 includes RAMO$_4$ layer (ScAlMgO$_4$ layer) 101 having a (0001) surface as a principal surface, and layered product 120 on which n-type Group III nitride semiconductor layer 102, light emitting layer 103 and p-type Group III nitride semiconductor layer 104 are stacked. Further, LED 100 in this Embodiment also includes protective film 105 formed of an insulating film, n-side ohmic electrode 106 electrically connected to n-type Group III nitride semiconductor layer 102, p-side ohmic electrode 107 electrically connected to p-type Group III nitride semiconductor layer 104, pad electrode 108 and sub-mount-side electrode 109 disposed adjacent to n-side ohmic electrode 106 and p-side ohmic electrode 107, sub-mount substrate 110, and the like. The structure of the LED is not limited thereto, and the LED may have a different configuration. Further, any of these components may be omitted.

As described in detail with respect to a production method below, RAMO$_4$ layer (ScAlMgO$_4$ layer) 101 is a part of a base substrate for preparing LED 100. A degree of flatness of a surface, of the RAMO$_4$ layer 101, opposite to the layered product 120 is lower than a degree of flatness of a surface, of the RAMO$_4$ layer 101, adjacent to the layered product 120.

The degree of flatness of the surface, of RAMO$_4$ layer 101, adjacent to layered product 120 and the degree of flatness of the surface, of RAMO$_4$ layer 101, opposite to layered product 120 can be evaluated by an atomic force microscope (AFM), a stylus-type surface roughness meter, a laser-type three-dimensional shape measuring device, observation of a cross-section with SEM, or the like.

Figure 9:
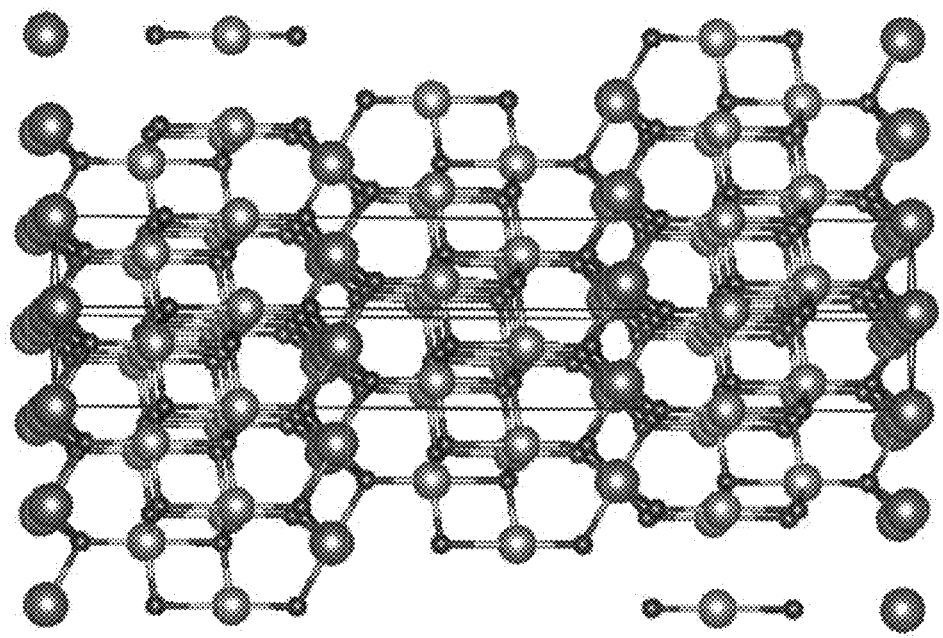
FIG. 9 is a schematic view of a crystal structure of ScAlMgO$_4$.

In this Embodiment, ScAlMgO$_4$ is used as RAMO$_4$. ScAlMgO$_4$ is a substance having a hexagonal (trigonal) crystal structure as space group R-3m as shown in FIG. 9. In substrates formed of the ScAlMgO$_4$, the degree of lattice mismatching with c-surface GaN, which is expressed by {(lattice constant of GaN–lattice constant of ScAlMgO$_4$)/lattice constant of GaN}, is as small as −1.5%. Thus, the substrates attract attention as substrates which can be expected to enable stacking of a high-quality Group III nitride semiconductor having less defects compared to conventional substrates. Studies conducted by the inventors of the present application have revealed that the dislocation density can be reduced to $5 \times 10^7$ cm$^{-2}$, which is about ⅕ of the dislocation density of c-surface sapphire (Al$_2$O$_3$) having a lattice mismatching as large as 16% with GaN. It has come to be apparent that LEDs having higher efficiency in terms of crystal quality can be provided. Further, ScAlMgO$_4$ is known to have cleavability along the c-surface, and as described in detail later, ScAlMgO$_4$ can be spontaneously peeled off by means of a difference in thermal expansion coefficients between the substrate and layered product 120 (GaN). Therefore, ScAlMgO$_4$ is suitable for attainment of a low-cost process.

On the other hand, layered product 120 may include at least light emitting layer 103, but in this Embodiment, n-type Group III nitride semiconductor layer 102, light emitting layer 103 and p-type Group III nitride semiconductor layer 104 are stacked in the order presented, and all these layers are formed of a Group III nitride semiconductor.

In this Embodiment, the "Group III nitride semiconductor" is a structure including any one of GaN, AlN and InN, or a mixture of two or more thereof. Light emitting layer 103 may be a single bulk layer, or have a multilayer structure such as quantum well structure. Further, n-type Group III nitride semiconductor layer 102 is formed of an n-type Group III nitride semiconductor having a bandgap larger than that of light emitting layer 103. On the other hand, p-type Group III nitride semiconductor layer 104 is formed of a p-type Group III nitride semiconductor layer having a bandgap larger than that of light emitting layer 103. n-type Group III nitride semiconductor layer 102 and p-type Group III nitride semiconductor layer 104 are disposed in such a manner as to sandwich light emitting layer 103.

Further, for protective film 105, n-side ohmic electrode 106, p-side ohmic electrode 107, pad electrode 108, sub-mount-side electrode 109, sub-mount substrate 110 and the like, the same materials and structures as those of the members of a known LED can be employed.

FIGS. 2A to 2I illustrate a process flow of production of a flip-chip LED in this Embodiment. A method for producing the LED in this Embodiment will be described in detail with reference to these drawings.

Forming Layered Product

First, as shown in FIG. 2A, ScAlMgO$_4$ substrate 101a having a (0001) surface as a principal surface is prepared. ScAlMgO$_4$ substrate 101a may be an off-angle substrate with a principal surface inclined at about 0 to 100 with respect to a (0001) surface.

Next, on ScAlMgO$_4$ substrate 101a, a crystal is grown by a vapor phase epitaxy method such as a HVPE method (hydride vapor phase epitaxy method), an OVPE method (oxide vapor phase epitaxy method) or a MOCVD method (metal organic chemical vapor deposition method) to form layered product 120 including n-type Group III nitride semiconductor layer 102, light emitting layer 103 and p-type Group III nitride semiconductor layer 104 as shown in FIG. 2B. Hereinafter, a crystal is grown by a MOCVD method in this Embodiment.

Trimethylgallium (TMG), trimethylindium (TMI), trimethylaluminum (TMA) or the like can be used as a Group III raw material, and ammonia ($NH_3$) gas can be used as a Group V raw material. Further, hydrogen ($H_2$) or nitrogen ($N_2$) can be used as a carrier gas during crystal growth. In this Embodiment, monosilane ($SiH_4$) is used as an n-type donor impurity in formation of the n-type Group III nitride semiconductor layer, and biscyclopentadienylmagnesium (Cp2Mg) is used as a p-type acceptor impurity in formation of the p-type Group III nitride semiconductor layer.

Layered product 120 can be formed in the following manner. First, the $ScAlMgO_4$ substrate is introduced into a MOCVD furnace, and subjected to heat cleaning under a hydrogen atmosphere at about 1,000° C. for 10 minutes. Consequently, carbon-based contaminants and the like adhering to a surface of the $ScAlMgO_4$ substrate are removed. Thereafter, the substrate is cooled to 500° C., and an amorphous low-temperature buffer layer (in this Embodiment, a layer formed of GaN (not shown)) with a thickness of about 50 nm is deposited. The thickness of the buffer layer can be adjusted by a crystal growth time, a growth temperature and a ratio of Group III raw materials to be supplied.

After formation of the buffer layer, the temperature of $ScAlMgO_4$ substrate 101a is elevated to about 1,000° C. again, so that the buffer layer is recrystallized to form a crystal nucleus for main growth. Thereafter, an n-type GaN layer is formed as n-type Group III nitride semiconductor layer 102 at 1,000 to 1,100° C. In this Embodiment, an n-type GaN layer having a thickness of 50 µm is formed under the conditions of a growth temperature of 1,050° C., a growth rate of 10 µm/h and a V/III ratio of 200. Using $N_2$-diluted $SiH_4$ (10 ppm), the layer is doped with Si at a density of $1\times10^{18}$ $cm^{-3}$ as an n-type dopant. Here, for the purpose of improving crystal quality, the layer may be undoped in the initial stage of growth before the thickness reaches about 10 µm.

Next, light emitting layer 103 (GaN) having a quantum well structure including InGaN is stacked. Thereafter, a p-type GaN layer doped with magnesium (Mg) at a density of $1\times10^{19}$ $cm^{-3}$ is formed as p-type Group III nitride semiconductor layer 104. Consequently, LED structure layered product 120 of PN junction type is prepared. As a connection layer, an undoped GaN layer (not shown) may be inserted into each of an interface between light emitting layer 103 and n-type Group III nitride semiconductor layer 102 and an interface between light emitting layer 103 and p-type Group III nitride semiconductor layer 104. When light emitting layer 103 is spatially separated from n-type Group III nitride semiconductor layer 102 or p-type Group III nitride semiconductor layer 104, improvement of the quality of light emitting layer 103 and improvement of the efficiency of light emission can be expected. As a contact layer, a p-type GaN layer doped with Mg at a density of $1\times10^{20}$ $cm^{-3}$ (not shown) may be further stacked on the outermost surface of layered product 120. This can be expected to reduce p-side contact resistance.

Peeling

In this Embodiment, a large part of $ScAlMgO_4$ substrate 101a is spontaneously peeled off from layered product 120 during temperature-fall after crystal growth by the MOCVD method as shown in FIG. 2C. This process takes advantage of the facts that stress is generated with temperature fall due to a difference between the thermal expansion coefficient ($5.6\times10^{-6}$ $K^{-1}$ or less) of GaN in the a-axis direction and the thermal expansion coefficient ($6.9\times10^{-6}$ $K^{-1}$ or less) of $ScAlMgO_4$ in the a-axis direction, and that $ScAlMgO_4$ has c-surface cleavability. In the process, cleavage of $ScAlMgO_4$ spontaneously occurs in the vicinity of a GaN/$ScAlMgO_4$ interface.

For ensuring that the nitride semiconductor layer (layered product 120) of the LED is not broken nor cracked by impact at the time of peeling, it is necessary to promote spontaneous peeling, and to impart strength by sufficiently increasing the thickness of n-type Group III nitride semiconductor layer 102. As a result of studies conducted by the inventors of the present application, it has been found that when the thickness of n-type Group III nitride semiconductor layer 102 adjacent to $ScAlMgO_4$ substrate 101a is 50 µm or more, it is possible to perform peeling without breaking the n-type Group III nitride semiconductor layer. Since the strength of a film increases as a layer is thickened, the thickness of n-type Group III nitride semiconductor layer 102 is preferably 50 µm or more, more preferably 100 µm or more. Since cleaving of $ScAlMgO_4$ substrate 101a occurs in $ScAlMgO_4$ substrate 101a, thin film-shaped $ScAlMgO_4$ layer 101 remains on one surface of n-type Group III nitride semiconductor layer 102.

A sapphire substrate which has been conventionally used has no c-surface cleavability. Thus, for peeling off the sapphire substrate, thermal stress may be applied to cause cleavage. However, when thermal stress is applied, breakage and cracking are apt to occur in a layered product for relaxation of the stress. In particular, in an LED structure with an n-type Group III nitride semiconductor layer having a large thickness, breakage and cracking are apt to occur in the n-type Group III nitride semiconductor layer, and thus use as an LED is not possible. Thus, in the case of a sapphire substrate, the thickness of an n-type Group III nitride semiconductor layer is often kept small to reduce the amount of residual thermal stress.

In this Embodiment, layered product 120 is prepared by crystal growth using a MOCVD method in forming the layered product. It is also possible to perform growth of light emitting layer 103 by a MOCVD method twice with different apparatuses after stacking thick n-type Group III nitride semiconductor layer 102 by HVPE method. In this case, a plurality of temperature-elevation and temperature-fall processes are involved, and therefore process design is needed to prevent peeling of $ScAlMgO_4$ substrate 101a in a process other than the peeling, due to generation of thermal stress.

On the other hand, when MO-HVPE equipment including all of an organometal compound raw material (MO raw material), a Ga raw material and HCl gas is provided, an LED structure (layered product 120) can be prepared by performing the growth once. In this case, it is desirable that the thickness of the n-type Group III nitride semiconductor layer be about 100 µm to 200 µm.

Forming Device

Formation of a device will now be described. First, as shown in FIG. 2D, a region of layered product 120, on which n-side electrode 106 is formed, is patterned by photolithography. Specifically, p-type Group III nitride semiconductor layer 104, light emitting layer 103 and n-type Group III nitride semiconductor layer 102 are partially removed by dry etching. The dry etching may be ICP dry etching using a chlorine-based gas such as $Cl_2$ or $BCl_3$, or the like.

Thereafter, protective film 105 formed of $SiO_2$ is deposited over the entire surface of layered product 120 by plasma-enhanced CVD as shown in FIG. 2E. It is possible to deposit the protective film by normal-pressure CVD or sputtering deposition. Protective film 105 may have a thickness which ensures sufficient insulation, and the thickness of protective film 105, while being preferably about 100 to 500 nm, is 200 nm in this Embodiment.

Next, n-side ohmic electrode 106 is formed. Specifically, protective film 105 is patterned by photolithography, and protective film 105 is then removed by wet etching with a buffer hydrofluoric acid (BHF) solution. Subsequently, as shown in FIG. 2F, n-side ohmic electrode 106 formed of Ti/Al/Au is formed on a surface to which a part of n-type Group III nitride semiconductor layer 102 is exposed.

Subsequently, patterning by photolithography and wet etching by BHF are similarly performed, and p-side ohmic electrode 107 formed of Ag/Ti/Au is then formed in a region to which a part of p-type Group III nitride semiconductor layer 104 is exposed. In the case of a flip-chip LED, it is preferable that a material having a high reflectivity is used for a p-side electrode, and a material containing Ag as a main component is often used for the p-side electrode; however, when Ag alone is used, there is a problem in heat resistance and corrosion resistance. Thus, an Ag alloy containing a very small amount of additives may be used.

Next, as shown in FIG. 2G pad electrode 108 is formed on n-side ohmic electrode 106 and p-side ohmic electrode 107 by Au plating. The thickness of pad electrode 108 in Au plating, while being preferably 10 μm or more and 100 μm or less, is 20 μm in this Embodiment.

Finally, division is performed into LED chips by dicing, and as shown in FIGS. 2H and 2I, the chips are bonded to sub-mount substrate 110 on which sub-mount-side electrode 109 is formed in a pattern shape beforehand. In this way, flip-chip LED device 100 can be prepared.

Group III Nitride Semiconductor Light Emitting Diode

As described above, in this Embodiment, the thickness of the n-type Group III nitride semiconductor layer is set to 50 μm or more to impart strength in forming the layered product, whereby in the peeling, $ScAlMgO_4$ substrate 101a itself can be spontaneously cleaved, so that a large part of the substrate can be peeled off. Here, cleavage is apt to occur in the vicinity of an interface where stress is most densely concentrated, and therefore in this Embodiment, cleavage occurs at a site close to an interface between $ScAlMgO_4$ substrate 101a and n-type Group III nitride semiconductor layer 102. Thin film-shaped $ScAlMgO_4$ layer 101 remains on n-type Group III nitride semiconductor layer 102. The thickness of remaining $ScAlMgO_4$ layer 101 is approximately several nm to several μm, and cleavage does not occur in a complete single plane. Thus, the surface of $ScAlMgO_4$ layer 101 has slight irregularities. Therefore, the surface flatness (degree of flatness) of $ScAlMgO_4$ layer 101 remaining after peeling is lower than the flatness of a surface of $ScAlMgO_4$ layer 101 at an interface between $ScAlMgO_4$ layer 101 and n-type Group III nitride semiconductor layer 102. Surface irregularities can be determined by an AFM, a stylus-type surface roughness meter, a laser-type three-dimensional shape measuring device, observation of a cross-section with SEM, or the like as described above, and in this Embodiment, it is determined that surface irregularities are present when the ratio of arithmetic mean roughness Ra to reference length L is L/100 or more. For example, it can be said that surface irregularities are present when Ra is larger than 0.1 μm where L is 10 μm, or when Ra is larger than 10 nm where L is 1 μm. The inventors of the present application have found that the light extraction efficiency of LED 100 is effectively improved when $ScAlMgO_4$ layer 101 has low flatness and a small thickness.

Figure 3:
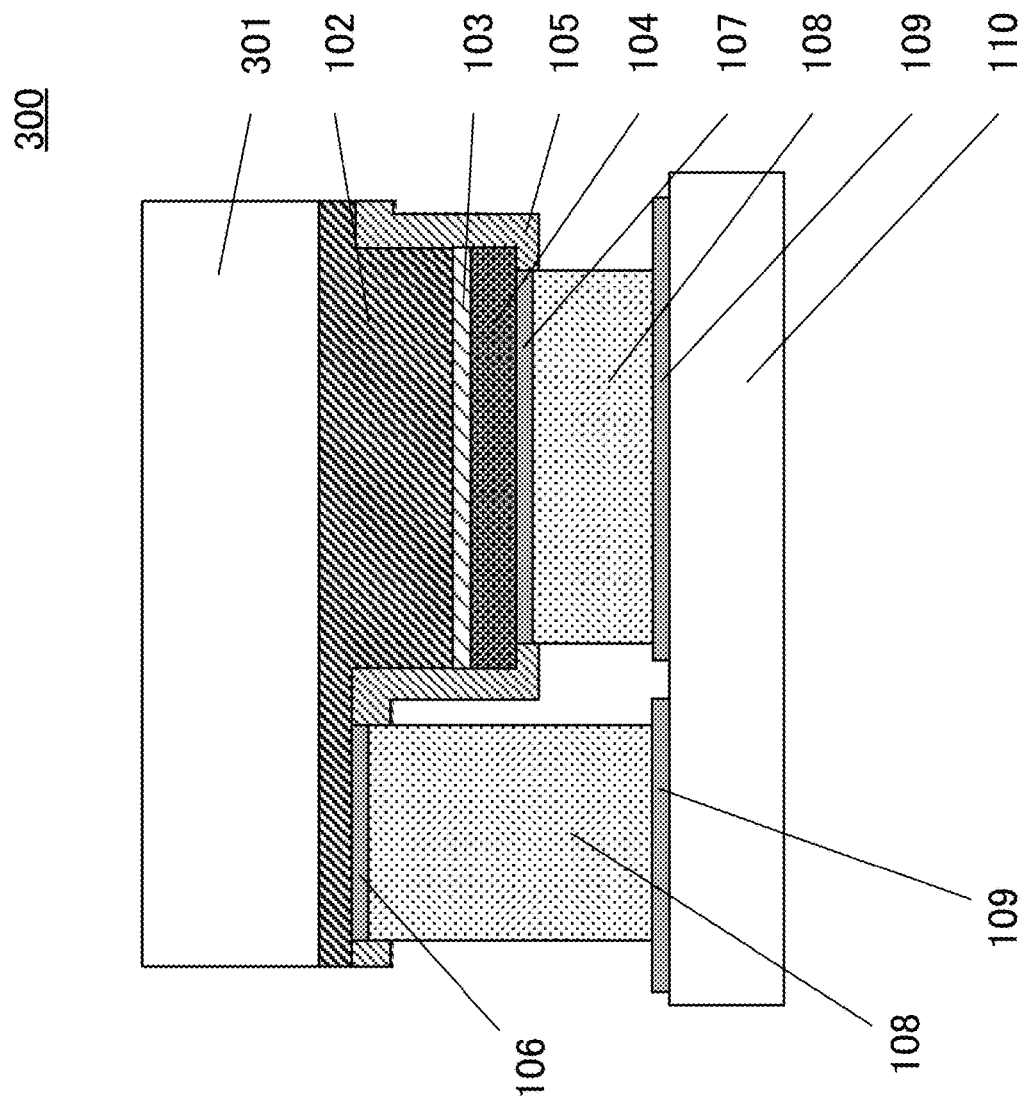
FIG. 3 is a schematic view of a Group III nitride semiconductor light emitting diode which is obtained using an RAMO$_4$ substrate and which has a conventional configuration.

FIG. 3 is a schematic sectional view when LED 300 having the same structure as that of a conventional LED is prepared using a $ScAlMgO_4$ substrate. In preparation of LED 300, the thickness of n-type Group III nitride semiconductor layer 102 is decreased to about 5 μm to reduce the total amount of film stress. Thus, the LED is prepared without peeling off $ScAlMgO_4$ substrate 301.

Figure 4:
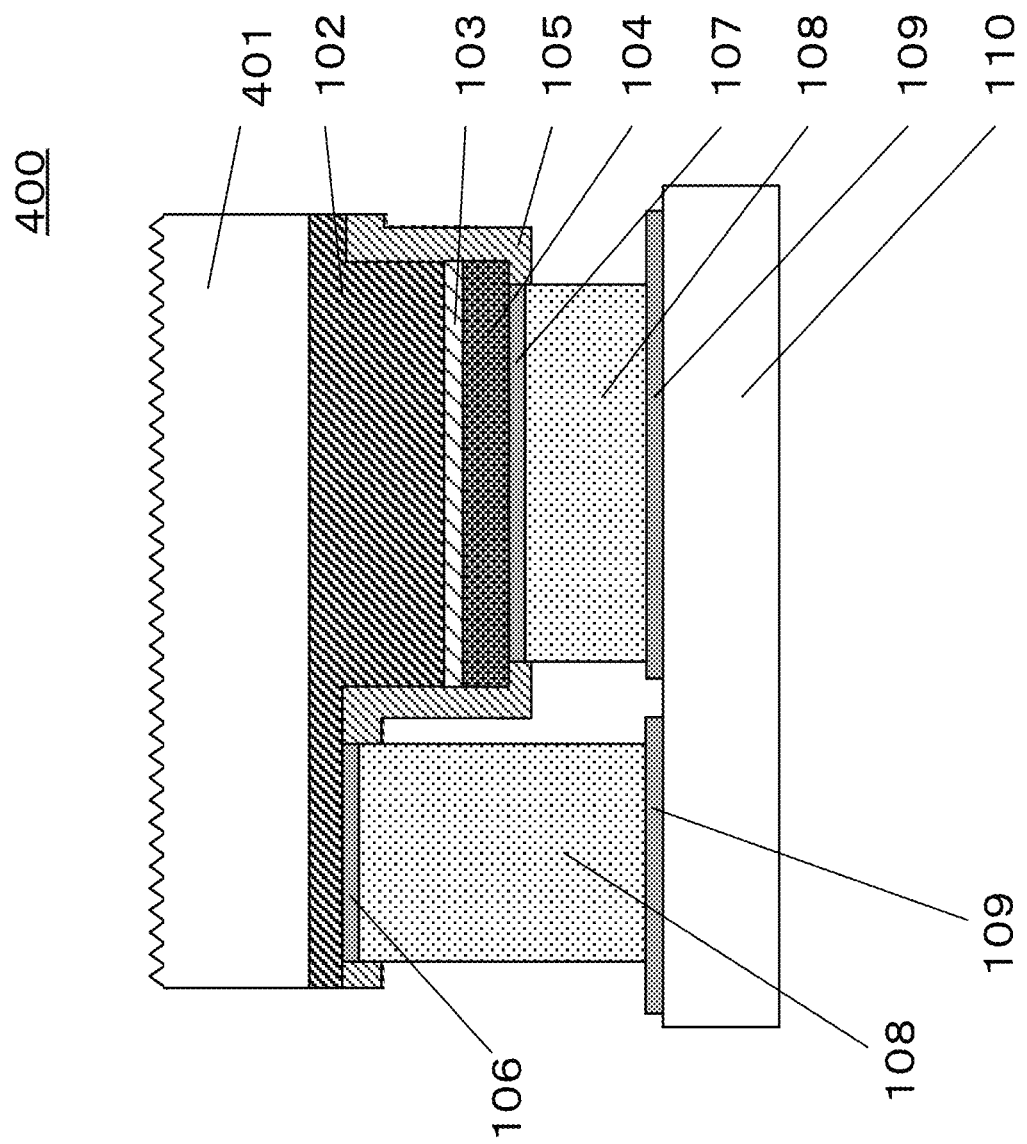
FIG. 4 is a schematic view of a modification of a Group III nitride semiconductor light emitting diode which is obtained using an RAMO$_4$ substrate and which has a conventional configuration.

In the case of such a flip-chip LED, light emitted from light emitting layer 103 is extracted outside through $ScAlMgO_4$ substrate 301. Thus, in LED 300 shown in FIG. 3, it becomes easier to extract light as a difference in refractive indices between $ScAlMgO_4$ substrate 301 and n-type Group III nitride semiconductor layer 102 decreases. Further, it is well known that in extraction of light outside LED 300 from $ScAlMgO_4$ substrate 301, extraction efficiency is improved as a difference in refractive indices between $ScAlMgO_4$ substrate 301 and an external atmosphere (air) adjacent to the substrate decreases. The refractive index of $ScAlMgO_4$ for light having a wavelength of 450 nm is 1.87, and the refractive index of a sapphire substrate for light having a wavelength of 450 nm is 1.77. It can be said that $ScAlMgO_4$ has a refractive index closer to that of n-type Group III nitride semiconductor layer 102, and allows light to be more easily extracted from light emitting layer 103. Further, as a method for efficiently extracting light outside (to air) from $ScAlMgO_4$ substrate 301, a method is known in which irregularities are formed on a light extraction surface as shown in FIG. 4. Formation of an irregular surface provides an effect of reducing total reflection components by changing an angle at which light is incident to an interface. LED 400 shown in FIG. 4 has the same configuration as that of LED 300 shown in FIG. 3 except that substrate 401 having irregularities on a light extraction surface is used.

In contrast, it has been revealed that when $ScAlMgO_4$ substrate 101a is spontaneously peeled off to remove a large part of $ScAlMgO_4$ substrate 101a while leaving only a part of $ScAlMgO_4$ substrate 101a ($ScAlMgO_4$ layer 101) as in this Embodiment, light extraction efficiency is effectively improved. It is considered that since irregularities are randomly generated on the surface of $ScAlMgO_4$ layer 101 by cleavage at the time of peeling, and $ScAlMgO_4$ layer 101 has a very small thickness of approximately several nm to several μm, the effect of multiple reflection is enhanced, resulting in improvement of light extraction efficiency. That is, when $ScAlMgO_4$ layer 101 has a thickness of more than 0 μm and 10 μm or less, the possibility increases that light undergoes multiple reflection 10 or more times in an LED chip having a size of about 500 μm square to 1,000 μm square. As a result, the reflection angle may be changed at the irregular surface of $ScAlMgO_4$ layer 101 to increase the probability that light is extracted outside. $ScAlMgO_4$ layer 101 may be in the form of an extremely thin film of the order of nm, and in this case the effect of multiple reflection is obtained, and therefore there is no lower limit on the thickness.

In the peeling, there may occur some regions where $ScAlMgO_4$ substrate 101a is fully removed incidentally, leading to exposure of n-type Group III nitride semiconductor layer 102. Such a region corresponds to an opening portion of a $ScAlMgO_4$ layer as described in detail in Embodiment 2 below. Thus, it is considered that even if there occurs such a region, the region does not cause reduction of light extraction efficiency.

Figure 7:
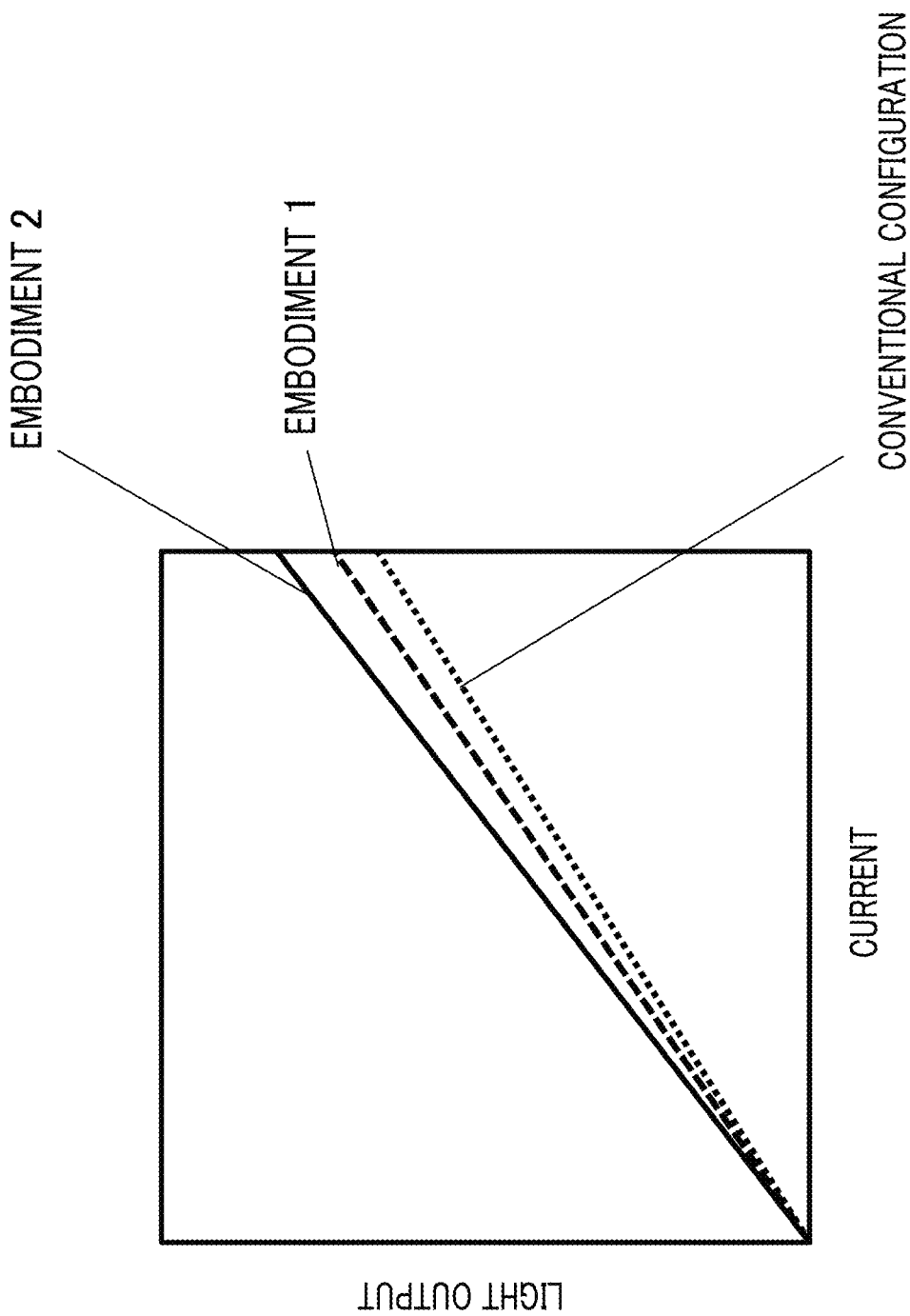
FIG. 7 illustrates the current-light output characteristics of the Group III nitride semiconductor light emitting diodes in Embodiments 1 and 2 of the present disclosure and the Group III nitride semiconductor light emitting diode having a conventional configuration.
Figure 8:
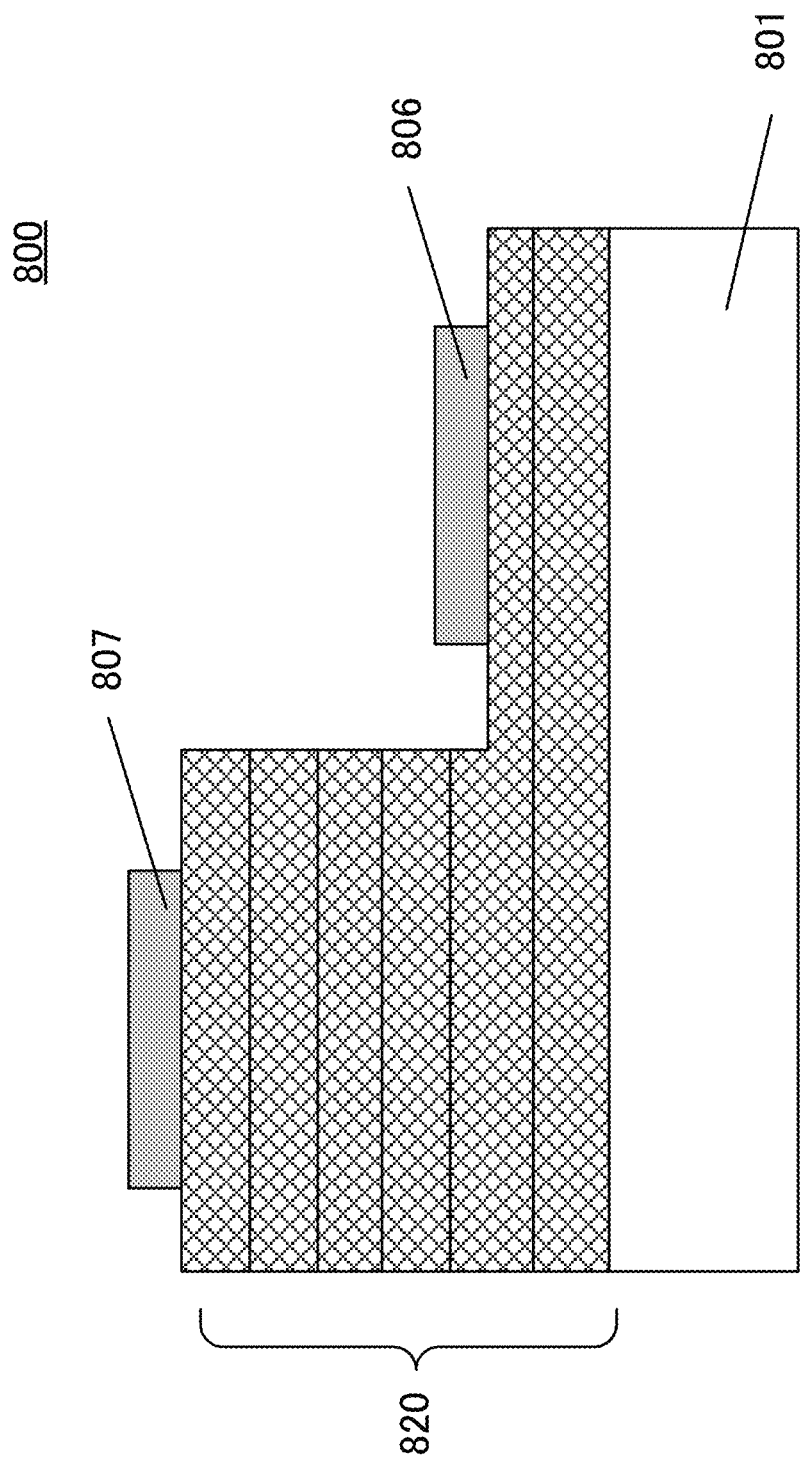
FIG. 8 illustrates a conventional Group III nitride semiconductor light emitting diode described in Patent Document 1.

FIG. 7 is a diagram of comparison between the current-light output characteristics of LED 100 in Embodiment 1 and LED 300 of conventional structure which is prepared without peeling off $ScAlMgO_4$ substrate 301. It is apparent that when the $ScAlMgO_4$ substrate is partially peeled off to be turned into a ScAlMgO$_4$ layer having irregularities, the light output can be increased by about 5 to 10%.

According to the LED in this Embodiment, the light output at a constant current can be increased as compared to conventional LEDs, and an LED having higher efficiency can be provided.

Embodiment 2

Figure 5:
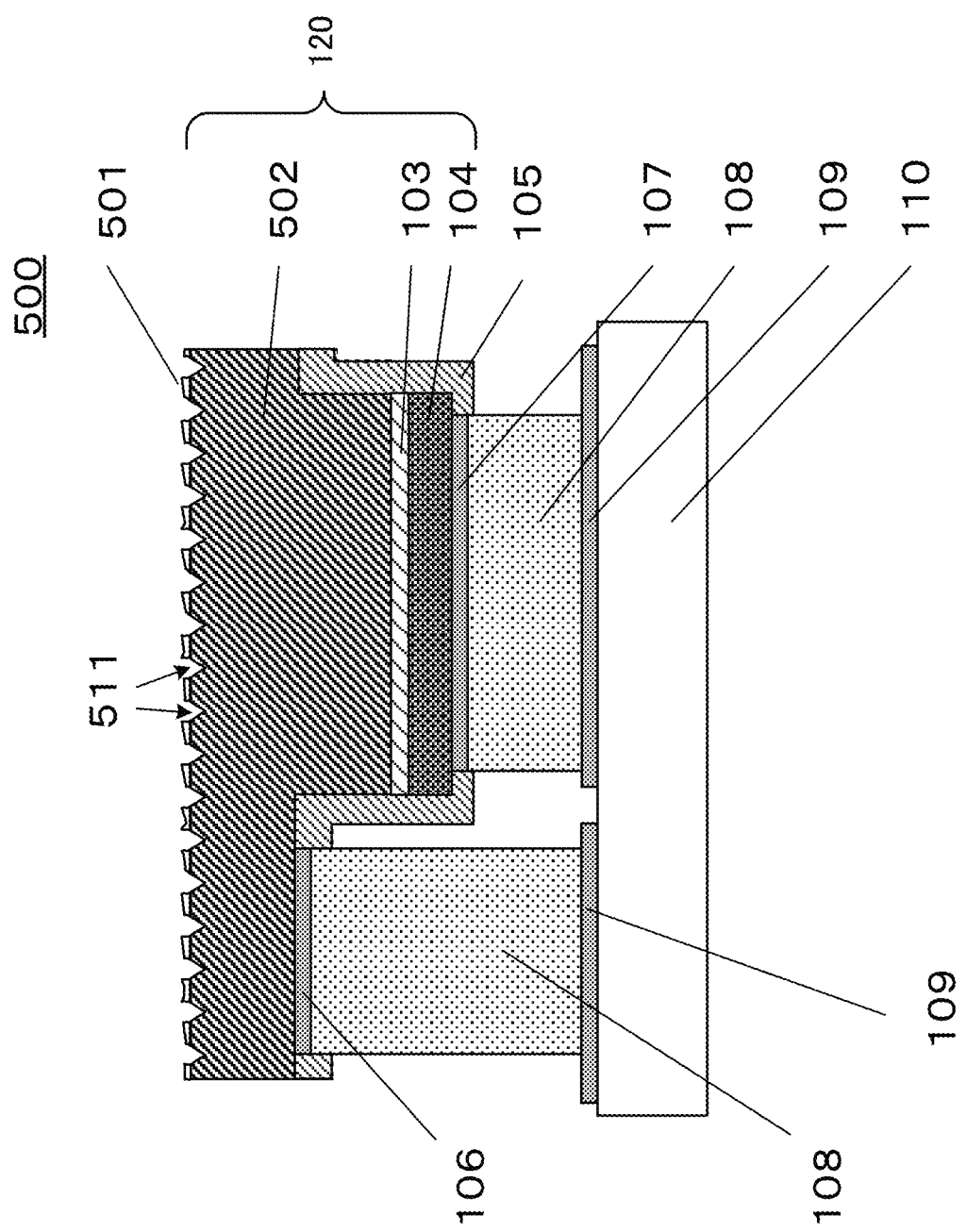
FIG. 5 is a schematic view of a Group III nitride semiconductor light emitting diode in Embodiment 2 of the present disclosure.

FIG. 5 illustrates flip-chip Group III nitride semiconductor light emitting diode (LED) 500 in Embodiment 2 of the present disclosure. The LED has the same configuration as in Embodiment 1 except that the structure of a light extraction surface is different from that in Embodiment 1. The same members as in Embodiment 1 are given the same symbols, and detailed descriptions thereof are omitted.

As shown in FIG. 5, LED 500 in this Embodiment includes RAMO$_4$ layer 501 having a (0001) surface as a principal surface, and layered product 120 including light emitting layer 103. In this Embodiment, a ScAlMgO$_4$ layer is used as RAMO$_4$ layer 501.

Here, in this Embodiment, opening portions 511 are formed on ScAlMgO$_4$ layer 501. Further, a recess is formed on a layered product (here, n-type Group III nitride semiconductor layer 502) at opening portion 511 of ScAlMgO$_4$ layer 501. Further, in this Embodiment, a degree of flatness of a surface, of the RAMO$_4$ layer 501, opposite to the layered product 120 is lower than a degree of flatness of a surface, of the RAMO$_4$ layer 501, adjacent to the layered product 120. The degree of flatness degree can be determined by the method described above.

FIGS. 6A to 6I illustrate a process flow of production of the flip-chip LED in Embodiment 2 of the present invention. A method for producing the LED in this Embodiment will be described in detail with reference to these drawings. Descriptions of the same steps as in Embodiment 1 are omitted as appropriate.

Forming Recess

Figure 6A:
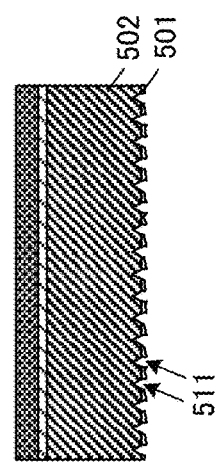
FIGS. 6A to 6I are schematic diagrams illustrating a production flow of the Group III nitride semiconductor light emitting diode in Embodiment 2 of the present disclosure.

First, as shown in FIG. 6A, ScAlMgO$_4$ substrate 501a having a (0001) surface as a principal surface is prepared. ScAlMgO$_4$ substrate 501a may be an off-angle substrate with a principal surface inclined at about 0 to 100 with respect to a (0001) surface.

An underlying GaN layer (not shown) with a thickness of 3 μm is grown on ScAlMgO$_4$ substrate 501a using a MOCVD method. Next, opening portions are formed on the underlying GaN layer by photolithography and dry etching. Further, with the underlying GaN layer as a mask, ScAlMgO$_4$ substrate 501a is etched to form on ScAlMgO$_4$ substrate 501a a recess which will form opening portion 511 later. ScAlMgO$_4$ substrate 501a can be etched with a solution obtained by heating a sulfuric acid-hydrogen peroxide solution (mixed liquid of concentrated sulfuric acid and hydrogen peroxide water) to about 80° C. The depth of the recess formed on ScAlMgO$_4$ substrate 501a is 3 μm in this Embodiment. The depth of the recess can be controlled by the etching time, and is preferably about 1 μm to 10 μm.

Forming Layered Product

Figure 6B:
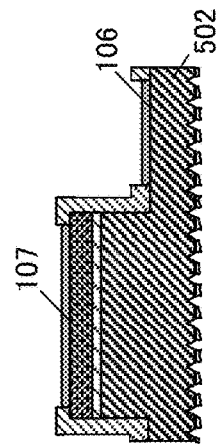
Figure 6C:
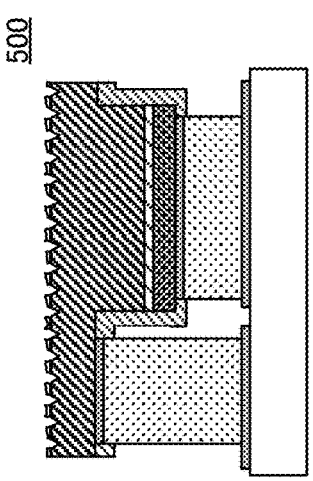

Next, as shown in FIG. 6B, layered product 120 is formed on ScAlMgO$_4$ substrate 501a prepared in the above forming of recess, the ScAlMgO$_4$ substrate having an underlying GaN layer in a pattern shape, and a recess.

In this Embodiment, MO-HVPE equipment including a MO raw material, a Ga raw material and HCl gas is used for crystal growth of the layered product. As a Group III raw material, an organometal raw material such as trimethylgallium (TMG), trimethylindium (TMI) or trimethylaluminum (TMA), or GaCl obtained by reacting metallic gallium (Ga) with HCl gas can be used. As a Group V raw material, ammonia (NH$_3$) gas can be used. As a carrier gas, hydrogen (H$_2$) or nitrogen (N$_2$) can be used. Dichlorosilane (SiH$_2$Cl$_2$) can be used as an n-type donor impurity, and biscyclopentadienylmagnesium (Cp2Mg) can be used as a p-type acceptor impurity.

First, on the ScAlMgO$_4$ substrate introduced into a MO-HVPE furnace, an n-type GaN layer is formed as n-type Group III nitride semiconductor layer 502 at 1,000 to 1,100° C. In this Embodiment, an n-type GaN layer having a thickness of 150 μm is formed under the conditions of a growth temperature of 1,050° C., a growth rate of 200 μm/h and a V/III ratio of 20 in a HVPE mode. Using SiH$_2$Cl$_2$, the layer is doped with Si at a density of $1 \times 10^{18}$ cm$^{-3}$ as an n-type dopant. Here, for the purpose of improving crystal quality, the layer may be undoped in the initial stage of growth before the thickness reaches about 10 μm.

Next, light emitting layer 103 having a quantum well structure including InGaN is stacked in a MOCVD mode. Finally, p-type GaN layer 104 doped with magnesium (Mg) at a density of $1 \times 10^{19}$ cm$^{-3}$ is formed as a p-type Group III nitride semiconductor layer to prepare an LED structure (layered product 120) of PN junction type. As a connection layer (not shown), an undoped GaN layer may be inserted into each of an interface between light emitting layer 103 and n-type Group III nitride semiconductor layer 502 and an interface between light emitting layer 103 and p-type Group III nitride semiconductor layer 104. When light emitting layer 103 is spatially separated from n-type Group III nitride semiconductor layer 502 or p-type Group III nitride semiconductor layer 104, improvement of the quality of light emitting layer 103 and improvement of the efficiency of light emission can be expected. Further, as a contact layer, a p-type GaN layer doped with Mg at a density of $1 \times 10^{20}$ cm$^{-3}$ (not shown) may be stacked on the outermost surface.

In this Embodiment, collective growth is performed using MO-HVPE equipment including all of an organometal compound raw material (MO raw material), a Ga raw material and HCl gas, but it is also possible to prepare layered product 120 by performing growth two or more times using a MOCVD method and a HVPE method as in Embodiment 1.

Peeling

Subsequently, a large part of ScAlMgO$_4$ substrate 501a is spontaneously peeled off by means of a difference in thermal expansion coefficients between ScAlMgO$_4$ substrate 501a and a layered product (here, n-type Group III nitride semiconductor layer 502) during temperature-fall after crystal growth. For ensuring that the nitride semiconductor layer of the LED is not broken and cracked by impact at the time of peeling, it is necessary to promote spontaneous peeling of ScAlMgO$_4$ substrate 501a, and to impart strength by sufficiently increasing the thickness of n-type Group III nitride semiconductor layer 502. Since the strength of a film increases as a layer is thickened, the thickness of n-type Group III nitride semiconductor layer 502 is preferably 50 μm or more, more preferably about 100 to 200 μm. In this Embodiment, a thick n-type GaN layer (n-type Group III nitride semiconductor layer 502) having a thickness of 150 μm is formed by means of a high growth rate in a HVPE mode as described above.

Here, since cleavage of ScAlMgO$_4$ substrate 501a occurs within ScAlMgO$_4$, thin film-shaped ScAlMgO$_4$ layer 501 slightly remains on one surface of n-type Group III nitride semiconductor layer 502. In this Embodiment, a recess is formed on ScAlMgO$_4$ substrate 501a beforehand, and therefore a void (gap) is formed at an interface between ScAlMgO$_4$ substrate 501a and n-type Group III nitride semiconductor layer 502. Thus, opening portions 511 are formed on ScAlMgO$_4$ layer 501 remaining after spontaneous peeling, and recesses are formed on the n-type Group III nitride semiconductor layer at opening portions 511.

Here, the thickness of remaining ScAlMgO$_4$ layer 501 is approximately several nm to several μm, and cleavage does not occur in a complete single plane. Thus, the surface of ScAlMgO$_4$ layer 501 has slight irregularities. Therefore, the surface flatness (degree of flatness) of ScAlMgO$_4$ layer 501 remaining after peeling is lower than the surface flatness of ScAlMgO$_4$ layer 501 at an interface with n-type Group III nitride semiconductor layer 502. Surface irregularities can be determined by the above-described method.

Forming Device

Figure 6D:
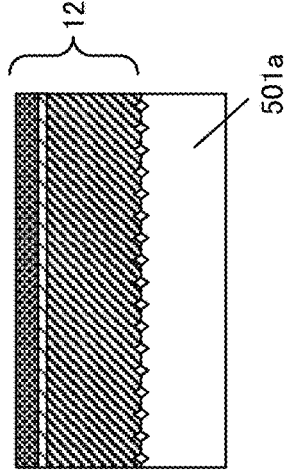
Figure 6E:
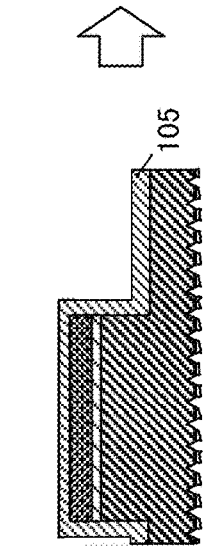
Figure 6F:
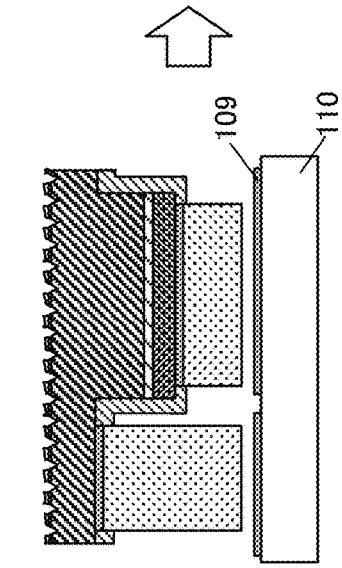
Figure 6G:
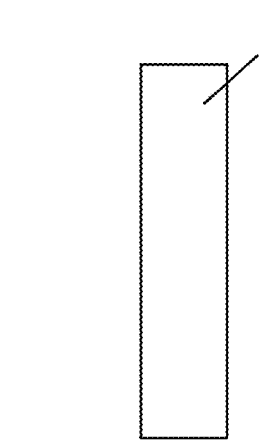
Figure 6H:
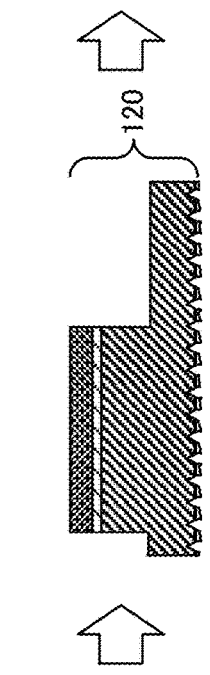
Figure 6I:
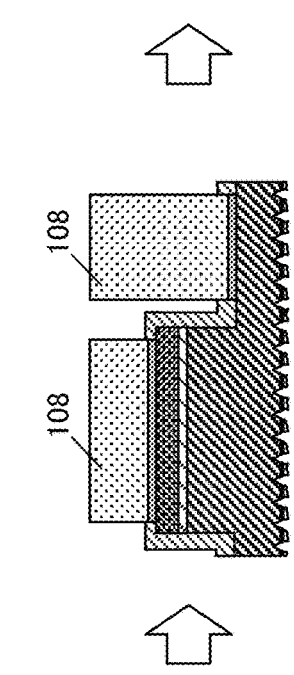

In forming the device, a region of layered product 120, on which n-side electrode 106 is formed, is patterned by photolithography as shown in FIG. 6D. Thereafter, protective film 105 formed of SiO$_2$ is deposited over the entire surface by plasma-enhanced CVD as shown in FIG. 6E. Next, patterning is performed by photolithography, and protective film 105 is then partially removed. As shown in FIG. 6F, n-side ohmic electrode 106 is formed on a surface to which a part of n-type Group III nitride semiconductor layer 502 is exposed, and p-side ohmic electrode 107 is formed on a surface to which a part of p-type Group III nitride semiconductor layer 104 is exposed. As shown in FIG. 6G pad electrode 108 is formed on n-side ohmic electrode 106 and p-side ohmic electrode 107. Thereafter, division is performed into LED chips by dicing, and as shown in FIGS. 6H and 6I, the chips are bonded to sub-mount substrate 110 on which sub-mount-side electrode 109 is formed in a pattern shape beforehand. In this way, flip-chip LED device 500 is prepared.

Group III Nitride Semiconductor Light Emitting Diode

In this Embodiment, since ScAlMgO$_4$ layer 501 remaining after peeling has opening portions 511, light reflected within ScAlMgO$_4$ layer 501 can also be extracted from a side surface of the opening portion 511 of ScAlMgO$_4$ layer 501. Thus, light extraction efficiency is improved. Further, since recesses are formed on n-type Group III nitride semiconductor layer 502 (layered product 120) exposed at opening portions 511, improvement of light extraction efficiency in this region can be expected.

In this Embodiment, the pattern or pitch of opening portions 511 follows the pattern of the layout of dot-shaped triangular lattices discretely disposed in ScAlMgO$_4$. The shape and the layout of opening portions 511 and remaining ScAlMgO$_4$ layer 501 are not particularly limited thereto, and any pattern may be applied for the shape, the layout method, the positive/negative direction and the like. For example, the effective pitch or size of opening portions 511 may be in the order of submicron to several tens of microns. In view of ease of pattern formation and the degree of the effect, the pitch is preferably 1 μm to 50 μm, and a pitch of 15 μm is applied in this Embodiment. A pitch of less than 1 μm is not preferable because it becomes difficult to form opening portions 511 by wet etching in forming the recess, leading to markedly reduced yield. On the other hand, a pitch of 50 μm or more is not preferable because a sufficient number of opening portions 511 are not formed with respect to the size of a general LED chip (500 μm square to 1,000 μm square), and thus the effect of opening portions 511 is limited.

FIG. 7 illustrates the current-light output characteristics of the LED in Embodiment 2. It is apparent that the LED in this Embodiment can attain a light output higher by about 5 to 10% than that of the LED in Embodiment 1 above.

According to the LED in this Embodiment, the light output at a constant current can be increased as compared to conventional LEDs, and an LED having higher efficiency can be provided.

Other Embodiments

In Embodiment 1 and Embodiment 2 above, a ScAlMgO$_4$ substrate is used as a base substrate, but it is also possible to use, as a base substrate, an RAMO$_4$ substrate including a single crystal which is different from ScAlMgO$_4$ and which is represented by the general formula RAMO$_4$ (wherein R represents one or more trivalent elements selected from the group consisting of Sc, In, Y and lanthanoid elements, A represents one or more trivalent elements selected from the group consisting of Fe (III), Ga and Al, and M represents one or more divalent elements selected from the group consisting of Mg, Mn, Fe (II), Co, Cu, Zn and Cd). It is also possible to use an RAMO$_4$ substrate including a single crystal having a stoichiometric composition deviated from ScAlMgO$_4$ to a certain degree.

INDUSTRIAL APPLICABILITY

A Group III nitride semiconductor light emitting diode according to the present disclosure can be provided as a high-efficiency LED having light extraction efficiency higher than that of a conventional LED.

REFERENCE SIGNS LIST

100, 300, 400, 500, 800 Group III nitride semiconductor light emitting diode (LED)
101a, 301, 401, 501a RAMO$_4$ substrate (ScAlMgO$_4$ substrate)
101, 501 RAMO$_4$ layer (ScAlMgO$_4$ layer)
102, 502 n-type Group III nitride semiconductor layer
103 Light emitting layer
104 p-type Group III nitride semiconductor layer
105 Protective film
106, 806 n-side electrode (n-side ohmic electrode)
107, 807 p-side electrode (p-side ohmic electrode)
108 Pad electrode
109 Sub-mount-side electrode
110 Sub-mount substrate
120, 820 Layered product

The invention claimed is:

1. A flip-chip Group III nitride semiconductor light emitting diode, comprising:
    an RAMO$_4$ layer including a single crystal represented by the general formula RAMO$_4$, wherein R represents one or more trivalent elements selected from the group consisting of Sc, In, Y and lanthanoid elements, A represents one or more trivalent elements selected from the group consisting of Fe (III), Ga and Al, and M represents one or more divalent elements selected from the group consisting of Mg, Mn, Fe (II), Co, Cu, Zn and Cd;
    a layered product stacked on the RAMO$_4$ layer;
    an n-type electrode, and
    a p-type electrode, wherein
    the layered product includes at least a light emitting layer including a Group III nitride semiconductor,
    the layered product further comprises an n-type Group III nitride semiconductor layer disposed on one side of the light emitting layer, and a p-type Group III nitride semiconductor layer disposed on another side of the light emitting layer, the $RAMO_4$ layer is disposed adjacent to the n-type Group III nitride semiconductor layer, a degree of flatness of a surface, of the $RAMO_4$ layer, opposite to the layered product is lower than a degree of flatness of a surface, of the $RAMO_4$ layer, adjacent to the layered product, the $RAMO_4$ layer includes one or more opening portions, and the layered product is exposed at the opening portion, the n-type Group III nitride semiconductor layer has a recess at the one or more opening portions of the $RAMO_4$ layer, the n-type electrode is electrically connected to the n-type Group III nitride semiconductor layer of the layered product, the p-type electrode is electrically connected to the p-type Group III nitride semiconductor layer of the layered product, and the n-type electrode and the p-type electrode are disposed on the same side of the layered product opposite to the $RAMO_4$ layer, a thickness of the n-type Group III nitride semiconductor layer is 50 m or more, and a thickness of the $RAMO_4$ layer is 10 m or less.

2. The Group III nitride semiconductor light emitting diode according to claim 1, wherein the $RAMO_4$ layer is a layer including $ScAlMgO_4$.

\* \* \* \* \*